United States Patent
Won

(10) Patent No.: US 11,937,505 B2
(45) Date of Patent: Mar. 19, 2024

(54) THERMOELECTRIC DEVICE

(71) Applicant: LG INNOTEK CO., LTD., Seoul (KR)

(72) Inventor: Boone Won, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 17/758,261

(22) PCT Filed: Dec. 24, 2020

(86) PCT No.: PCT/KR2020/019098
§ 371 (c)(1),
(2) Date: Jun. 30, 2022

(87) PCT Pub. No.: WO2021/141302
PCT Pub. Date: Jul. 15, 2021

(65) Prior Publication Data
US 2023/0041077 A1      Feb. 9, 2023

(30) Foreign Application Priority Data
Jan. 7, 2020   (KR) .................. 10-2020-0002125

(51) Int. Cl.
*H10N 10/17*    (2023.01)
*H10N 10/852*   (2023.01)

(52) U.S. Cl.
CPC .......... *H10N 10/17* (2023.02); *H10N 10/852* (2023.02)

(58) Field of Classification Search
CPC .............................. H10N 10/17; H10N 10/852
See application file for complete search history.

(56) References Cited

U.S. PATENT DOCUMENTS

| 2016/0093789 A1* | 3/2016 | Himmer | H10N 10/01 |
| | | | 136/201 |
| 2021/0083165 A1* | 3/2021 | Jo | H10N 10/13 |

FOREIGN PATENT DOCUMENTS

| JP | 2003-298126 A | 10/2003 |
| JP | 2003-324218 A | 11/2003 |

(Continued)

OTHER PUBLICATIONS

International Search Report dated Mar. 29, 2021 in International Application No. PCT/KR2020/019098.
(Continued)

*Primary Examiner* — Lindsey A Buck
(74) *Attorney, Agent, or Firm* — Saliwanchik, Lloyd & Eisenschenk

(57) ABSTRACT

A thermoelectric element according to one embodiment of the present disclosure includes a lower metal substrate, a lower insulating layer disposed on the lower metal substrate, a plurality of lower electrodes disposed on the lower insulating layer to be spaced apart from each other, a plurality of P-type thermoelectric legs and a plurality of N-type thermoelectric legs disposed on the plurality of lower electrodes, a plurality of upper electrodes disposed on the plurality of P-type thermoelectric legs and the plurality of N-type thermoelectric legs to be spaced apart from each other, an upper insulating layer disposed on the plurality of upper electrodes, and an upper metal substrate disposed on the upper insulating layer, wherein the lower insulating layer includes a first insulating layer disposed on the lower metal substrate and a plurality of second insulating layers disposed on the first insulating layer to be spaced apart from each other.

19 Claims, 13 Drawing Sheets

(56) References Cited

FOREIGN PATENT DOCUMENTS

| | | |
|---|---|---|
| JP | 2004-274072 A | 9/2004 |
| JP | 2009-260173 A | 11/2009 |
| KR | 10-2015-0084310 A | 7/2015 |
| KR | 10-2019-0090523 A | 8/2019 |
| KR | 10-2020155 B1 | 9/2019 |
| KR | 10-2019-0116066 A | 10/2019 |
| WO | 2019/082932 A1 | 5/2019 |
| WO | WO-2019146991 A1 * | 8/2019 ............. H01L 35/02 |

OTHER PUBLICATIONS

Supplementary European Search Report dated Nov. 28, 2023 in European Application No. 20912956.8.
Office Action dated Jan. 10, 2024 in Korean Application No. 10-2020-0002125.

* cited by examiner

THERMOELECTRIC DEVICE

CROSS-REFERENCE TO RELATED APPLICATIONS

This application is the U.S. national stage application of International Patent Application No. PCT/KR2020/019098, filed Dec. 24, 2020, which claims the benefit under 35 U.S.C. § 119 of Korean Application No. 10-2020-0002125, filed Jan. 7, 2020, the disclosures of each of which are incorporated herein by reference in their entirety.

TECHNICAL FIELD

The present disclosure relates to a thermoelectric element, and more specifically, to an insulating layer of a thermoelectric element.

BACKGROUND ART

A thermoelectric phenomenon is a phenomenon which occurs due to movement of electrons and holes in a material and refers to direct energy conversion between heat and electricity.

A thermoelectric element is a generic term for a device using the thermoelectric phenomenon and has a structure in which a P-type thermoelectric material and an N-type thermoelectric material are joined between metal electrodes to form a PN junction pair.

Thermoelectric elements can be classified into a device using temperature changes of electrical resistance, a device using the Seebeck effect, which is a phenomenon in which an electromotive force is generated due to a temperature difference, a device using the Peltier effect, which is a phenomenon in which heat absorption or heat generation by current occurs, and the like. The thermoelectric element is variously applied to home appliances, electronic components, communication components, or the like. For example, the thermoelectric element can be applied to a cooling device, a heating device, a power generation device, or the like. Accordingly, the demand for thermoelectric performance of the thermoelectric element is increasing more and more.

The thermoelectric element includes substrates, electrodes, and thermoelectric legs, a plurality of thermoelectric legs are arranged in an array shape between an upper substrate and a lower substrate, a plurality of upper electrodes are arranged between the plurality of thermoelectric legs and the upper substrate, and a plurality of lower electrodes are arranged between the plurality of thermoelectric legs and the lower substrate. In this case, one of the upper substrate and the lower substrate can be a low-temperature part, and the other can be a high-temperature part.

Meanwhile, when the thermoelectric element is applied to an apparatus for power generation, power generation performance increases as a temperature difference between the low-temperature part and the high-temperature part increases. For example, the temperature of the high-temperature part can rise to 200° C. or higher. When the temperature of the high-temperature part is 200° C. or higher, thermal stress is applied to the substrate at the high-temperature part side due to a difference in coefficient of thermal expansion between the substrate at the high-temperature part side and the electrode, and thus an electrode structure can be destroyed. When the electrode structure is destroyed, a crack can be applied to a bonding surface between a solder arranged on the electrode and the thermoelectric leg and thus can lower the reliability of the thermoelectric element.

Meanwhile, in order to enhance the heat transfer performance of the thermoelectric element, attempts to use metal substrates are increasing. Generally, the thermoelectric element can be manufactured according to a process of sequentially stacking electrodes and thermoelectric legs on a metal substrate which is prepared in advance. When the metal substrate is used, an advantageous effect can be obtained in terms of heat conduction, but there is a problem in that reliability is lowered when used for a long time due to a low withstand voltage.

Accordingly, there is a need for a thermoelectric element of which not only heat conduction performance but also withstand voltage performance and thermal stress relaxation performance are improved.

DISCLOSURE

Technical Problem

The present disclosure is directed to providing an insulating layer of a thermoelectric element of which all of heat conduction performance, withstand voltage performance, and thermal stress relaxation performance are improved.

Technical Solution

According to an aspect of the present disclosure, there is provided a thermoelectric element including a lower metal substrate, a lower insulating layer disposed on the lower metal substrate, a plurality of lower electrodes disposed on the lower insulating layer to be spaced apart from each other, a plurality of P-type thermoelectric legs and a plurality of N-type thermoelectric legs disposed on the plurality of lower electrodes, a plurality of upper electrodes disposed on the plurality of P-type thermoelectric legs and the plurality of N-type thermoelectric legs to be spaced apart from each other, an upper insulating layer disposed on the plurality of upper electrodes, and an upper metal substrate disposed on the upper insulating layer, wherein the lower insulating layer includes a first insulating layer disposed on the lower metal substrate and a plurality of second insulating layers disposed on the first insulating layer to be spaced apart from each other.

The plurality of lower electrodes may be disposed on the plurality of second insulating layers to correspond to the plurality of second insulating layers.

A separation distance between the plurality of lower electrodes may be 0.6 to 2.8 times a separation distance between the plurality of second insulating layers.

At least one of the plurality of second insulating layers may be further disposed on a part of a side surface of at least one of the plurality of lower electrodes.

A maximum thickness of the at least one of the plurality of second insulating layers disposed on the part of the side surface of the at least one of the plurality of lower electrodes may be 0.2 to 0.75 times a maximum thickness of the at least one of the plurality of lower electrodes.

A coefficient of thermal expansion of the first insulating layer may be larger than a coefficient of thermal expansion of each of the second insulating layers.

A thickness of the first insulating layer may be larger than a thickness of each of the second insulating layers.

The first insulating layer may be a resin layer including a silicone resin and an inorganic material, and the second insulating layer may be an aluminum oxide layer or a composite layer formed of a composite including silicon and aluminum.

The upper insulating layer may include a third insulating layer disposed under the upper metal substrate and a fourth insulating layer disposed under the third insulating layer.

The fourth insulating layer may include a plurality of fourth insulating layers which are disposed to be spaced apart from each other.

The plurality of upper electrodes may be disposed under the plurality of fourth insulating layers to correspond to the plurality of fourth insulating layers.

Advantageous Effects

According to an embodiment of the present disclosure, a thermoelectric element of which performance is excellent and reliability is high can be obtained. Specifically, according to the embodiment of the present disclosure, a thermoelectric element of which not only heat conduction performance but also withstand voltage performance and thermal stress relaxation performance are improved can be obtained.

The thermoelectric element according to the embodiment of the present disclosure can be applied not only to an application implemented in a small size but also to an application implemented in a large size such as a vehicle, a ship, a steel mill, an incinerator, or the like.

MODES OF THE INVENTION

Hereinafter, preferable embodiments of the present disclosure will be described in detail with reference to the accompanying drawings.

However, the technical spirit of the present disclosure is not limited to some embodiments which will be described and may be embodied in various forms, and one or more elements in the embodiments may be selectively combined and replaced to be used within the scope of the technical spirit of the present disclosure.

Further, terms used in the embodiments of the present disclosure (including technical and scientific terms), may be interpreted with meanings that are generally understood by those skilled in the art unless particularly defined and described, and terms which are generally used, such as terms defined in a dictionary, may be understood in consideration of their contextual meanings in the related art.

In addition, terms used in the description are provided not to limit the present disclosure but to describe the embodiments.

In the specification, the singular form may also include the plural form unless the context clearly indicates otherwise and may include one or more of all possible combinations of A, B, and C when disclosed as at least one (or one or more) of "A, B, and C".

In addition, terms such as first, second, A, B, (a), (b), and the like may be used to describe elements of the embodiments of the present disclosure.

The terms are only provided to distinguish the elements from other elements, and the essence, sequence, order, or the like of the elements are not limited by the terms.

Further, when particular elements are disclosed as being "connected," "coupled," or "linked" to other elements, the elements may include not only a case of being directly connected, coupled, or linked to other elements but also a case of being connected, coupled, or linked to other elements by elements between the elements and other elements.

In addition, when one element is disclosed as being formed "on or under" another element, the term "on or under" includes both a case in which the two elements are in direct contact with each other and a case in which at least another element is disposed between the two elements (indirectly). Further, when the term "on or under" is expressed, a meaning of not only an upward direction but also a downward direction may be included with respect to one element.

Figure 1:
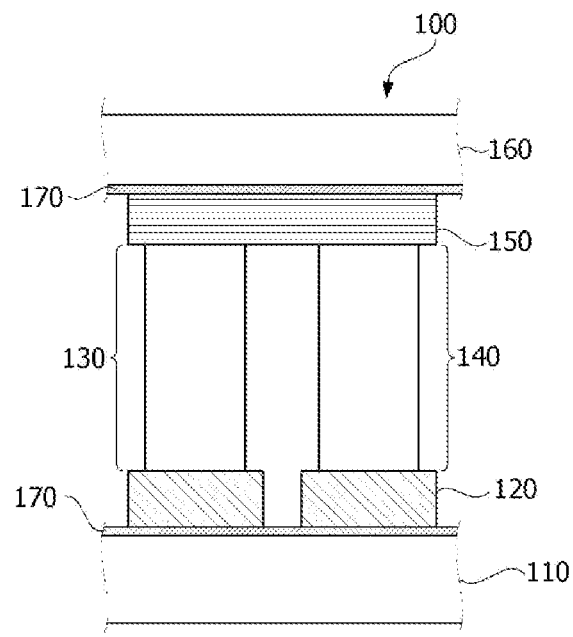
FIG. 1 is a cross-sectional view of a thermoelectric element.
Figure 2:
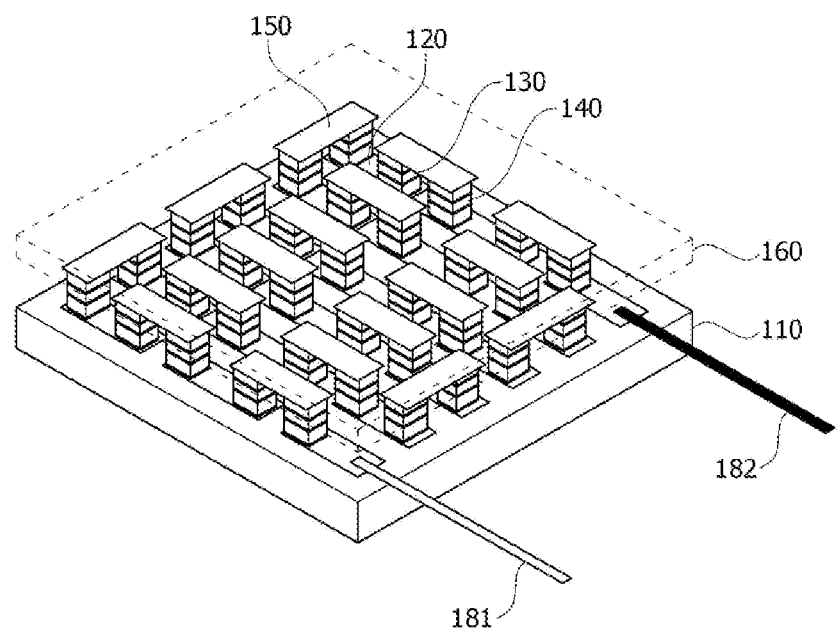
FIG. 2 is a perspective view of the thermoelectric element.
Figure 3:
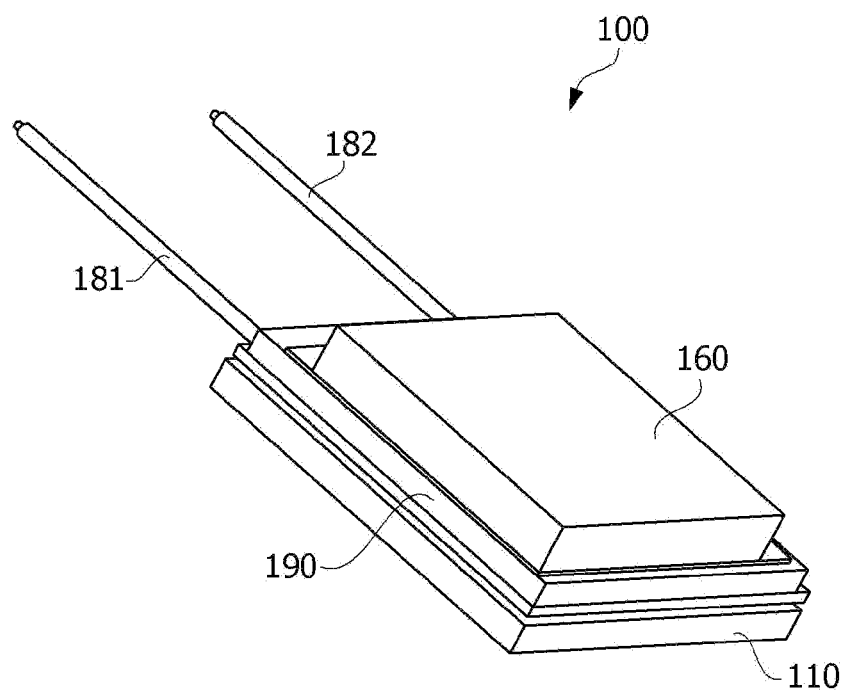
FIG. 3 is a perspective view of the thermoelectric element including a sealing member.
Figure 4:
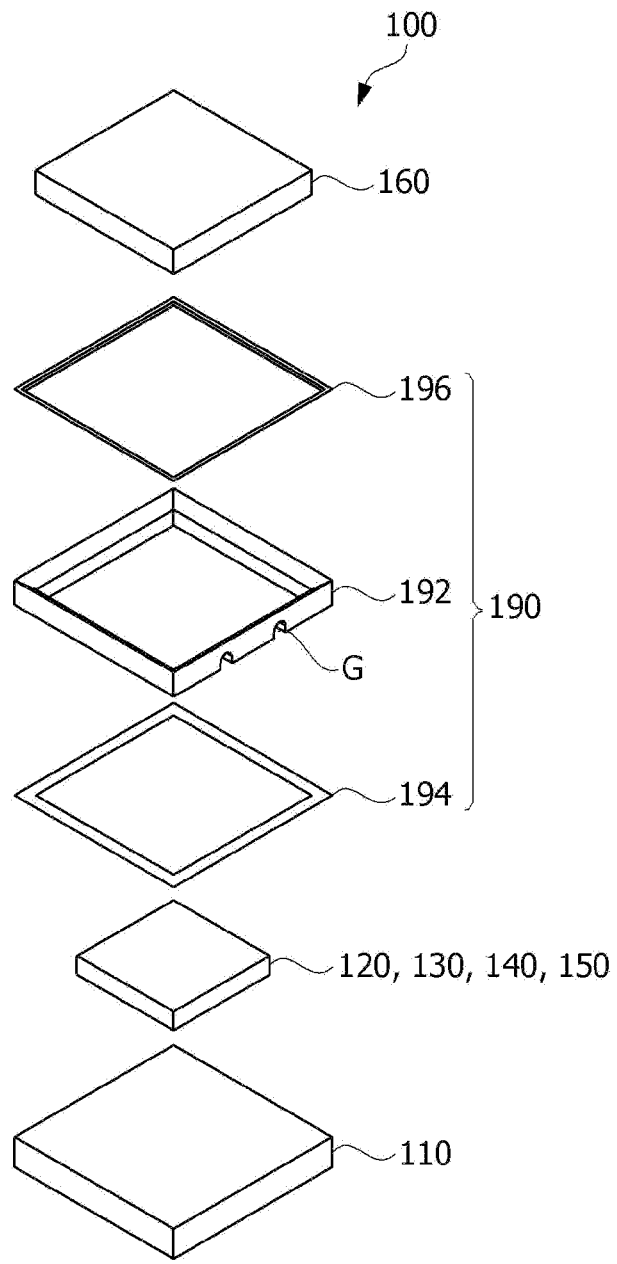
FIG. 4 is an exploded perspective view of the thermoelectric element including the sealing member.

FIG. 1 is a cross-sectional view of a thermoelectric element, FIG. 2 is a perspective view of the thermoelectric element, FIG. 3 is a perspective view of the thermoelectric element including a sealing member, and FIG. 4 is an exploded perspective view of the thermoelectric element including the sealing member.

Referring to FIGS. 1 and 2, a thermoelectric element 100 includes a lower substrate 110, lower electrodes 120, P-type thermoelectric legs 130, N-type thermoelectric legs 140, upper electrodes 150, and an upper substrate 160.

The lower electrodes 120 are disposed between the lower substrate 110 and lower surfaces of the P-type thermoelectric legs 130 and the N-type thermoelectric legs 140, and the upper electrodes 150 are disposed between the upper substrate 160 and upper surfaces of the P-type thermoelectric legs 130 and the N-type thermoelectric legs 140. Accordingly, the plurality of P-type thermoelectric legs 130 and the plurality of N-type thermoelectric legs 140 are electrically connected by the lower electrodes 120 and the upper electrodes 150. One pair of the P-type thermoelectric leg 130 and the N-type thermoelectric leg 140 which are disposed between the lower electrode 120 and the upper electrode 150 and electrically connected to each other may form a unit cell.

For example, when a voltage is applied to the lower electrode 120 and the upper electrode 150 through lead lines 181 and 182, a substrate through which a current flows from the P-type thermoelectric legs 130 to the N-type thermoelectric legs 140 due to the Peltier effect may absorb heat to function as a cooling part, and a substrate through which a current flows from the N-type thermoelectric legs 140 to the P-type thermoelectric legs 130 may be heated to function as a heating part. Alternatively, when a temperature difference between the lower electrode 120 and the upper electrode 150 is applied, charges in the P-type thermoelectric legs 130 and the N-type thermoelectric legs 140 move due to the Seebeck effect, and thus electricity may be generated.

Here, the P-type thermoelectric leg 130 and the N-type thermoelectric leg 140 may be bismuth-telluride (Bi—Te)-based thermoelectric legs including bismuth (Bi) and tellurium (Te) as main raw materials. The P-type thermoelectric leg 130 may be a bismuth-telluride (Bi—Te)-based thermoelectric leg including at least one among antimony (Sb), nickel (Ni), aluminum (Al), copper (Cu), silver (Ag), lead (Pb), boron (B), gallium (Ga), tellurium (Te), bismuth (Bi), and indium (In). For example, the P-type thermoelectric leg 130 may include Bi—Sb—Te which is a main raw material in an amount of 99 to 99.999 wt % and may include at least one among nickel (Ni), aluminum (Al), copper (Cu), silver (Ag), lead (Pb), boron (B), gallium (Ga), and indium (In) in an amount of 0.001 to 1 wt % based on the total weight of 100 wt %. The N-type thermoelectric leg 140 may be a bismuth-telluride (Bi—Te)-based thermoelectric leg including at least one among selenium (Se), nickel (Ni), aluminum (Al), copper (Cu), silver (Ag), lead (Pb), boron (B), gallium (Ga), tellurium (Te), bismuth (Bi), and indium (In). For example, the N-type thermoelectric leg 140 may include Bi—Se—Te which is a main raw material in an amount of 99 to 99.999 wt % and may include at least one among nickel (Ni), aluminum (Al), copper (Cu), silver (Ag), lead (Pb), boron (B), gallium (Ga), and indium (In) in an amount of 0.001 to 1 wt % based on the total weight of 100 wt %. Accordingly, in the specification, the thermoelectric leg may also be referred to as a semiconductor structure, a semiconductor device, a semiconductor raw material layer, a semiconductor substance layer, a semiconductor material layer, a conductive semiconductor structure, a thermoelectric structure, a thermoelectric raw material layer, a thermoelectric substance layer, a thermoelectric material layer, or the like.

The P-type thermoelectric leg 130 and the N-type thermoelectric leg 140 may be formed in a bulk type or a stacked type. Generally, the bulk type P-type thermoelectric leg 130 or the bulk type N-type thermoelectric leg 140 may be obtained through a process of producing an ingot by heat-treating a thermoelectric material, pulverizing and sieving the ingot to obtain powder for thermoelectric legs, sintering the powder, and cutting the sintered object. In this case, the P-type thermoelectric leg 130 and the N-type thermoelectric leg 140 may be polycrystalline thermoelectric legs. For the polycrystalline thermoelectric legs, the powder for thermoelectric legs may be compressed at 100 to 200 MPa when sintered. For example, when the P-type thermoelectric leg 130 is sintered, the powder for thermoelectric legs may be sintered at 100 to 150 MPa, preferably, 110 to 140 MPa, and more preferably, 120 to 130 MPa. Further, when the N-type thermoelectric leg 140 is sintered, the powder for thermoelectric legs may be compressed at 150 to 200 MPa, preferably, 160 to 195 MPa, and more preferably, 170 to 190 MPa. Like the above, when the P-type thermoelectric leg 130 and the N-type thermoelectric leg 140 are the polycrystalline thermoelectric legs, strength of the P-type thermoelectric leg 130 and the N-type thermoelectric leg 140 may increase. The stacked type P-type thermoelectric leg 130 or the stacked type N-type thermoelectric leg 140 may be obtained through a process of forming a unit member by coating a paste including a thermoelectric material on a sheet-shaped base material and then stacking and cutting the unit member.

In this case, one pair of the P-type thermoelectric leg 130 and the N-type thermoelectric leg 140 may have the same shape and volume or may have different shapes and volumes. For example, since electrical conduction characteristics of the P-type thermoelectric leg 130 and the N-type thermoelectric leg 140 are different, a height or cross-sectional area of the N-type thermoelectric leg 140 may be formed differently from a height or cross-sectional area of the P-type thermoelectric leg 130.

In this case, the P-type thermoelectric leg 130 or the N-type thermoelectric leg 140 may have a cylindrical shape, a polygonal pillar shape, an oval pillar shape, and the like.

Alternatively, the P-type thermoelectric leg 130 or the N-type thermoelectric leg 140 may have a stacked structure. For example, the P-type thermoelectric leg 130 or the N-type thermoelectric leg 140 may be formed using a method of stacking a plurality of structures on which a semiconductor material is coated on a sheet-shaped base material and then cutting the structures. Accordingly, material loss may be inhibited and electrical conduction characteristics may be improved. Each structure may further include a conductive layer having an opening pattern, and accordingly, it is possible to increase an adhesion force between the structures, lower thermal conductivity, and increase electrical conductivity.

Alternatively, the P-type thermoelectric leg 130 or the N-type thermoelectric leg 140 may be formed to have different cross-sectional areas in one thermoelectric leg. For example, in the one thermoelectric leg, cross-sectional areas of both end portions disposed to face the electrodes may be formed larger than a cross-sectional area between both end portions. Accordingly, since a temperature difference between both end portions may be formed to be large, thermoelectric efficiency may increase.

The performance of the thermoelectric element according to one embodiment of the present disclosure may be expressed as a thermoelectric performance index (a figure of merit, ZT).

The thermoelectric performance index (ZT) may be expressed as in Equation 1.

$$ZT = \alpha^2 \cdot \sigma \cdot T / k \qquad \text{[Equation 1]}$$

Here, $\alpha$ is the Seebeck coefficient [V/K], $\sigma$ is electrical conductivity [S/m], and $\alpha^2 \sigma$ is a power factor (W/mK$^2$]). Further, T is a temperature, and k is thermal conductivity [W/mK]. k may be expressed as $a \cdot cp \cdot \rho$, wherein a is thermal diffusivity [cm$^2$/S], cp is specific heat [J/gK], and $\rho$ is density [g/cm$^3$].

In order to obtain the thermoelectric performance index of the thermoelectric element, a Z value (V/K) is measured using a Z meter, and the thermoelectric performance index (ZT) may be calculated using the measured Z value.

Here, the lower electrodes 120 disposed between the lower substrate 110 and the P-type thermoelectric legs 130 and the N-type thermoelectric legs 140, and the upper electrodes 150 disposed between the upper substrate 160 and the P-type thermoelectric legs 130 and the N-type thermoelectric legs 140 may each include at least one of copper (Cu), silver (Ag), aluminum (Al), and nickel (Ni) and each have a thickness of 0.01 mm to 0.3 mm. When the thickness of the lower electrode 120 or the upper electrode 150 is smaller than 0.01 mm, a function as an electrode may be degraded and thus electrical conduction performance may be lowered, and when the thickness of the lower electrode 120 or the upper electrode 150 is greater than 0.3 mm, conduction efficiency may be lowered due to an increase in resistance.

Further, the lower substrate 110 and the upper substrate 160 facing each other may be metal substrates, and the thicknesses thereof may be in a range of 0.1 mm to 1.5 mm. When the thickness of the metal substrate is smaller than 0.1 mm or greater than 1.5 mm, since heat dissipation characteristics or thermal conductivity may be excessively high, reliability of the thermoelectric element may be degraded. Further, when the lower substrate 110 and the upper substrate 160 are the metal substrates, insulating layers 170 may be further formed between the lower substrate 110 and the lower electrodes 120 and between the upper substrate 160 and the upper electrodes 150, respectively. Each of the insulating layers 170 may include a material having a thermal conductivity of 1 to 20 W/mK.

In this case, the lower substrate 110 and the upper substrate 160 may be formed to have different sizes. For example, a volume, a thickness, or an area of one of the lower substrate 110 and the upper substrate 160 may be formed to be larger than a volume, a thickness, or an area of the other one. Accordingly, it is possible to increase the heat absorption performance or heat dissipation performance of the thermoelectric element. Preferably, the volume, thickness, or area of the lower substrate 110 may be formed to be larger than at least one of the volume, thickness, or area of the upper substrate 160. In this case, the lower substrate 110 may be formed to have at least one of the volume, thickness, or area larger than that of the upper substrate 160 when the lower substrate 110 is disposed in a high-temperature region for the Seebeck effect, when the lower substrate 110 is applied as a heating region for the Peltier effect, or when a sealing member for protection from an external environment of a thermoelectric module which will be described later is disposed on the lower substrate 110. In this case, the area of the lower substrate 110 may be formed in a range of 1.2 to 5 times the area of the upper substrate 160. When the area of the lower substrate 110 is less than 1.2 times that of the upper substrate 160, an effect on enhancement of heat transfer efficiency is not high, and when the area of the lower substrate 110 exceeds 5 times that of the upper substrate 160, the heat transfer efficiency is significantly lowered, and a basic shape of the thermoelectric module may be difficult to maintain.

Further, a heat dissipation pattern, for example, an uneven pattern, may be formed on a surface of at least one of the lower substrate 110 and the upper substrate 160. Accordingly, the heat dissipation performance of the thermoelectric element may be increased. When the uneven pattern is formed on a surface which comes into contact with the P-type thermoelectric leg 130 or the N-type thermoelectric leg 140, a bonding characteristic between the thermoelectric leg and the substrate may also be enhanced. The thermoelectric element 100 includes the lower substrate 110, the lower electrodes 120, the P-type thermoelectric legs 130, the N-type thermoelectric legs 140, the upper electrodes 150, and the upper substrate 160.

As shown in FIGS. 3 and 4, sealing members 190 may be further disposed between the lower substrate 110 and the upper substrate 160. The sealing members 190 may be disposed on side surfaces of the lower electrodes 120, the P-type thermoelectric leg 130, the N-type thermoelectric leg 140, and the upper electrode 150 between the lower substrate 110 and the upper substrate 160. Accordingly, the lower electrodes 120, the P-type thermoelectric leg 130, the N-type thermoelectric leg 140, and the upper electrode 150 may be sealed from external moisture, heat, contamination, and the like. Here, the sealing member 190 may include a sealing case 192 disposed to be spaced a predetermined distance apart from side surfaces of the outermost portion of the plurality of lower electrodes 120, the outermost portion of the plurality of P-type thermoelectric legs 130 and the plurality of N-type thermoelectric legs 140, and the outermost portion of the plurality of upper electrodes 150, a sealing material 194 disposed between the sealing case 192 and the lower substrate 110, and a sealing material 196 disposed between the sealing case 192 and the upper substrate 160. Like the above, the sealing case 192 may come into contact with the lower substrate 110 and the upper substrate 160 through the sealing materials 194 and 196. Accordingly, when the sealing case 192 comes into direct contact with the lower substrate 110 and the upper substrate 160, heat conduction occurs through the sealing case 192, and thus, a problem in that the temperature difference between the lower substrate 110 and the upper substrate 160 is lowered may be inhibited. Here, the sealing materials 194 and 196 may include at least one of an epoxy resin and a silicone resin, or a tape of which both surfaces are coated with at least one of the epoxy resin and the silicone resin. The sealing materials 194 and 196 may serve to airtightly seal between the sealing case 192 and the lower substrate 110 and between the sealing case 192 and the upper substrate 160, may increase a sealing effect of the lower electrodes 120 and the P-type thermoelectric leg 130, and the N-type thermoelectric leg 140 and the upper electrode 150, and may be interchanged with a finishing material, a finishing layer, a waterproofing material, a waterproofing layer, and the like. Here, the sealing material 194 which seals between the sealing case 192 and the lower substrate 110 may be disposed on an upper surface of the lower substrate 110, and the sealing material 196 which seals between the sealing case 192 and the upper substrate 160 may be disposed on a side surface of the upper substrate 160. To this end, the area of the lower substrate 110 may be larger than the area of the upper substrate 160. Meanwhile, guide grooves G, which withdraw lead lines 180 and 182 connected to the electrodes, may be formed in the sealing case 192. To this end, the sealing case 192 may be an injection-molded product formed of plastic or the like and may be interchanged with a sealing cover. However, the above description of the sealing member is only an example, and the sealing member may be modified into various forms. Although not shown, a heat insulating material may be further included to surround the sealing member. Alternatively, the sealing member may include a heat insulating component.

In the above, the terms "lower substrate 110, lower electrode 120, upper electrode 150, and upper substrate 160" are used but are only arbitrarily referred to as upper and lower portions for ease of understanding and convenience of description, and positions may be reversed so that the lower substrate 110 and the lower electrode 120 may be disposed at an upper side, and the upper electrode 150 and the upper substrate 160 may be disposed at a lower side.

Figure 5A:
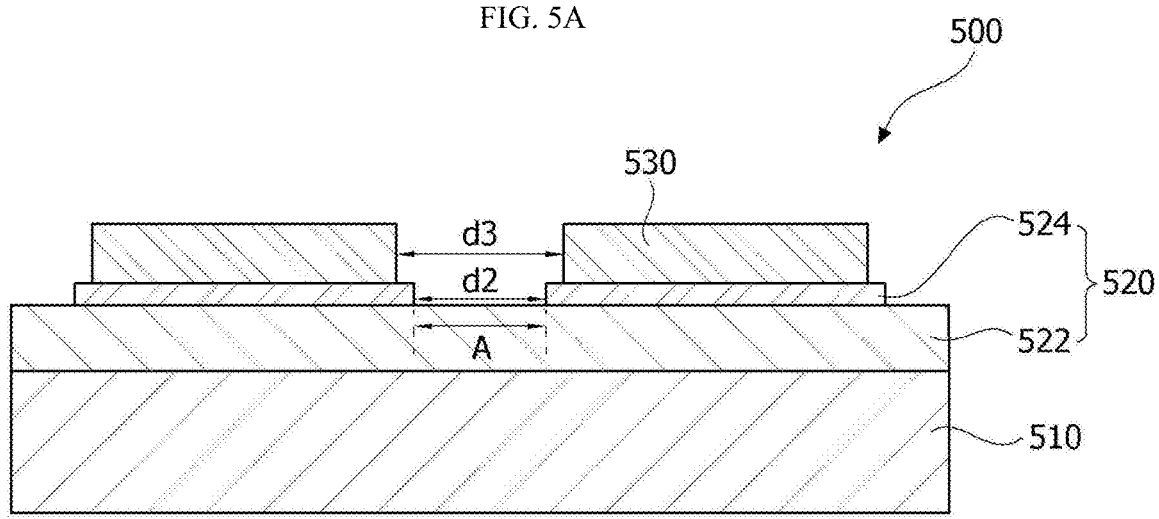
FIGS. 5A and 5B are cross-sectional views of a substrate, an insulating layer, and an electrode included in a thermoelectric element according to one embodiment of the present disclosure.
Figure 5B:
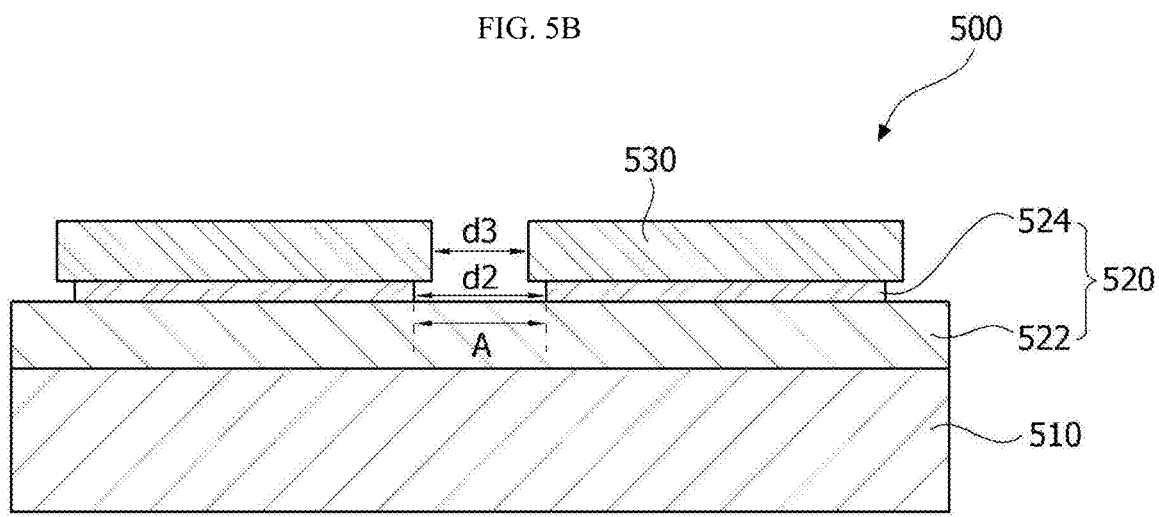
Figure 6:
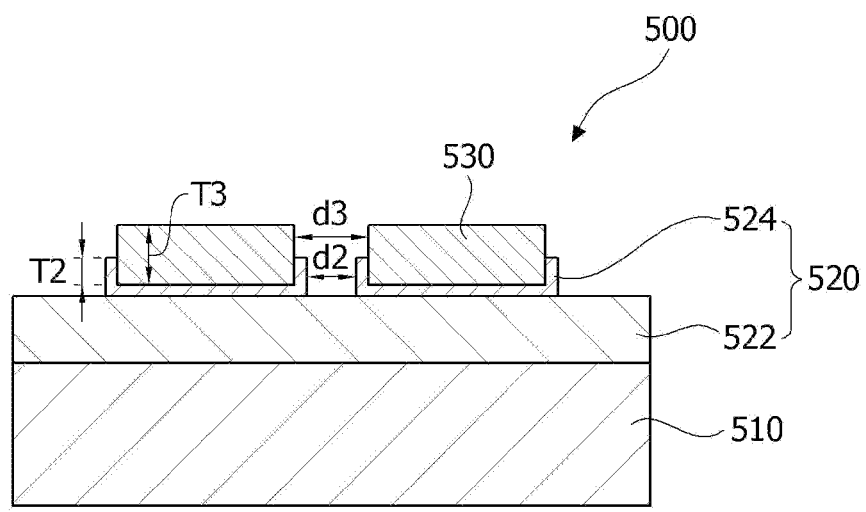
FIG. 6 is a cross-sectional view of a substrate, an insulating layer, and an electrode included in a thermoelectric element according to another embodiment of the present disclosure.

FIGS. 5A and 5B are cross-sectional views of a substrate, an insulating layer, and an electrode included in a thermoelectric element according to one embodiment of the present disclosure, FIG. 6 is a cross-sectional view of a substrate, an insulating layer, and an electrode included in a thermoelectric element according to another embodiment of the present disclosure, and FIGS. 7A-7D are views illustrating a process of manufacturing the substrate, the insulating layer, and the electrode in FIG. 6.

Referring to FIGS. 5A and 5B, a thermoelectric element 500 according to one embodiment of the present disclosure includes a substrate 510, an insulating layer 520 disposed on the substrate 510, a plurality of electrodes 530 disposed on the insulating layer 520 to be spaced apart from each other, and a plurality of P-type thermoelectric legs and a plurality of N-type thermoelectric legs (not shown) disposed on the plurality of electrodes 530.

Here, the substrate 510, the insulating layer 520, and the plurality of electrodes 530 may be the lower substrate 110, the insulating layer 170, and the lower electrodes 120 in FIGS. 1 to 4, or the upper substrate 160, the insulating layer 170, and the upper electrodes 150 in FIGS. 1 to 4. Overlapping descriptions of the same contents as those described in FIGS. 1 to 4 will be omitted. In this specification, "upper" and "lower" are terms for expressing relative positions between components, and when disposition of the components is totally reversed, "upper" may become "lower" and "lower" may become "upper". Here, the substrate 510 may be a metal substrate, for example, an aluminum substrate, a copper substrate, and an aluminum-copper alloy substrate. According to the embodiment of the present disclosure, a high-temperature part side substrate may be a copper substrate, and a low-temperature part side substrate may be an aluminum substrate. The copper substrate has higher thermal conductivity and electrical conductivity than the aluminum substrate. Accordingly, both high withstand voltage performance required at the low-temperature part side and high heat conduction performance required at the high-temperature part side may be satisfied.

Generally, when the thermoelectric element 500 is driven, the high-temperature part side of the thermoelectric element 500 may be exposed to a high temperature for a long time, and due to different coefficients of thermal expansion between the electrode and the substrate, shear stress may be transmitted to an interface between the electrode and the substrate. In the specification, the shear stress transferred to the interface between the electrode and the substrate due to different coefficients of thermal expansion between the electrode and the substrate is referred to as thermal stress. When the thermal stress exceeds a predetermined level, cracks may be applied to a bonding surface between a solder disposed on the electrode and the thermoelectric leg, and the cracks may degrade performance of the thermoelectric element and lower reliability.

According to the embodiment of the present disclosure, the insulating layer 520 may be disposed between the substrate 510 and the electrodes 530, and the insulating layer 520 may be disposed in double layers to alleviate thermal stress due to a difference in coefficient of thermal expansion between the substrate 510 and the electrodes 530.

According to the embodiment of the present disclosure, the insulating layer 520 includes a first insulating layer 522 disposed on the substrate 510 and a second insulating layer 524 disposed between the first insulating layer 522 and the electrode 530 on the first insulating layer 522. Here, the second insulating layer 524 may be a plurality of second insulating layers 524 disposed to be spaced apart from each other. According to the embodiment of the present disclosure, a total area of the first insulating layer 522 disposed on the substrate 510 may be larger than a total area of the second insulating layers 524 disposed on the first insulating layer 522.

Accordingly, since the first insulating layer 522 is disposed closer to the substrate 510 than the second insulating layers 524, and the first insulating layer 522 absorbs some of the thermal stress during a process of expanding or contracting according to a temperature change of the substrate 510, the thermal stress applied to the second insulating layers 524 may be reduced.

Specifically, when the plurality of second insulating layers 524 are disposed on the first insulating layer 522 to be spaced apart from each other, a region A where the second insulating layers 524 are not disposed may be present on the first insulating layer 522. Accordingly, even when the first insulating layer 522 expands or contracts according to the temperature change of the substrate 510, it is possible to minimize an influence of a force caused by expansion or contraction of the first insulating layer 522 on the second insulating layers 524, and a problem in that the second insulating layers 524 are deformed together with the expansion or contraction of the first insulating layer 522 may be inhibited.

In this case, a coefficient of thermal expansion of the first insulating layer 522 may be larger than a coefficient of thermal expansion of the second insulating layer 524. Alternatively, the Young's modulus of the first insulating layer 522 may be smaller than the Young's modulus of the second insulating layer 524. Further, withstand voltage performance of the second insulating layer 524 may be larger than withstand voltage performance of the first insulating layer 522. Alternatively, heat conduction performance of the second insulating layer 524 may be larger than heat conduction performance of the first insulating layer 522. Accordingly, when the substrate 510 expands or contracts, since the first insulating layer 522 which comes into contact with the substrate 510 expands or contracts together, thermal stress applied to the insulating layer 520 may be minimized. Further, due to the second insulating layers 524 which come into contact with the electrodes 530, the withstand voltage performance and the heat conduction performance of the entire insulating layer 520 may be increased.

Like the above, according to the embodiment of the present disclosure, an insulating layer structure of the thermoelectric element having all of thermal stress relaxation, withstand voltage performance, and heat conduction performance may be obtained.

Meanwhile, the plurality of electrodes 530 may be disposed on the plurality of second insulating layers 524 to correspond to the plurality of second insulating layers 524. That is, the plurality of second insulating layers 524 may be respectively disposed under of the plurality of electrodes 530. Alternatively, the second insulating layer 524 may include the plurality of second insulating layers 524 disposed to be spaced apart from each other, and the plurality of electrodes 530 may be respectively disposed on the second insulating layers 524 to be spaced apart from each other. For example, two electrodes 530, four electrodes 530, eight electrodes 530, or 16 electrodes 530 disposed to be spaced apart from each other may be respectively disposed on the second insulating layers 524. Like the above, when the first insulating layer 522 having a relatively large coefficient of thermal expansion is entirely disposed on the substrate 510, the second insulating layers 524 each having a relatively small coefficient of thermal expansion are disposed on the first insulating layer 522 to be spaced apart from each other, and the plurality of second insulating layers 524 and the plurality of electrodes 530 are disposed to correspond to each other, the second insulating layers 524 may not be thermally deformed even when the first insulating layer 522 expands or contracts according to the temperature change of the substrate 510, and accordingly, a problem in that the structure of the electrodes 530 is destroyed may be inhibited.

To this end, composition of the first insulating layer 522 may be different from composition of the second insulating layer 524. For example, the first insulating layer 522 may be a resin layer including a silicone resin and an inorganic material. For example, the Young's modulus of the first insulating layer 522 may be 1 to 150 MPa, preferably, 1 to 100 MPa, more preferably, 1 to 65 MPa, more preferably, 5 to 60 MPa, and more preferably, 10 to 50 MPa. In the embodiment, the Young's modulus may refer to the Young's modulus at 200° C. or less, and preferably, may refer to the Young's modulus at a temperature between 150° C. and 200° C. When the thermoelectric element is applied for power generation, power generation performance may increase as a temperature difference between the high-temperature part and the low-temperature part of the thermoelectric element increases. Accordingly, a temperature of the high-temperature part of the thermoelectric element may be 150° C. or higher, preferably, 180° C. or higher, and more preferably, 200° C. or higher. Accordingly, in the specification, a reference temperature which defines the Young's modulus of the first insulating layer 522 may be a temperature between 150° C. and 200° C. When the Young's modulus of the first insulating layer 522 satisfies this numerical range, since the first insulating layer is elongated together even when the substrate is thermally expanded, the thermal stress between the substrate and the electrode may be minimized, and a problem in that cracks occur in the thermoelectric leg may be inhibited. Here, the Young's modulus at each temperature may be measured by dynamic mechanical analysis (DMA) equipment.

In this case, when the Young's modulus of the first insulating layer 522 is smaller than 1 MPa, since the first insulating layer 522 becomes difficult to support between the substrate and the electrode, reliability of the thermoelectric element may be easily weakened under a small external shock or vibration environment. On the other hand, when the Young's modulus of the first insulating layer 522 exceeds 150 MPa, since the thermal stress between the substrate and the electrode increases, the possibility of an occurrence of the cracking at an interface in the thermoelectric element increases.

In this case, the silicone resin included in the first insulating layer 522 may include polydimethylsiloxane (PDMS), and the inorganic material may include at least one of oxide, carbide, and nitride of at least one of aluminum, titanium, zirconium, boron, and zinc. Here, a molecular weight of the PDMS may be 5,000 to 30,000 g/mol and, preferably, 15,000 to 30,000 g/mol. When the molecular weight of the PDMS satisfies this numerical range, since interchain bonding strength of the PDMS may be enhanced, the first insulating layer 522 may have the Young's modulus of 1 to 150 MPa. In this case, the first insulating layer 522 may further include a crosslinking agent, and a molecular weight of the crosslinking agent may be 500 to 2000 g/mol, and preferably, 1,000 to 2,000 g/mol. As the molecular weight of the crosslinking agent increases, a chain length of the crosslinking agent may increase.

Meanwhile, the inorganic material may be included in an amount of 60 to 90 wt %, and preferably, 80 to 90 wt % in the first insulating layer 522. In this case, in the inorganic material of the first insulating layer 522, D50 may be 30 to 40 µm. Accordingly, since a heat dissipation path may be optimized, the thermal conductivity of the first insulating layer 522 may be increased to 2 W/mK or more and, preferably, 3 W/mK or more.

Like the above, the first insulating layer 522 according to the embodiment of the present disclosure may not only relieve thermal stress due to the difference in coefficient of thermal expansion between the substrate and the electrode but also enhance an insulating property, bonding strength, and heat conduction performance between the substrate and the electrode.

Meanwhile, according to the embodiment of the present disclosure, the Young's modulus of the first insulating layer 522 disposed on the substrate 510 at the high-temperature part side may be different from the Young's modulus of the first insulating layer 522 disposed on the substrate 510 at the low-temperature part side. The Young's modulus of the first insulating layer 522 disposed on the substrate 510 at the high-temperature part side may be lower than the Young's modulus of the first insulating layer 522 disposed on the substrate 510 at the low-temperature part side. For example, the Young's modulus of the first insulating layer 522 disposed on the substrate 510 at the high-temperature part side may be 1 to 65 MPa, and the Young's modulus of the first insulating layer 522 disposed on the substrate 510 at the low-temperature part side may be 65 MPa or more and, preferably, 65 to 150 MPa. Accordingly, even when the substrate 510 at the high-temperature part side is thermally expanded, since the first insulating layer 522 may be elongated together, the thermal stress between the substrate and the electrode may be minimized, and a problem in that the crack occurs in the thermoelectric leg may be inhibited.

Further, according to the embodiment of the present disclosure, since the first insulating layer 522 at the high-temperature part side requires higher thermal stress relaxation performance, a thickness of the first insulating layer 522 at the high-temperature part side may be greater than a thickness of the first insulating layer 522 at the low-temperature part side.

Meanwhile, according to the embodiment of the present disclosure, the withstand voltage performance of the second insulating layer 524 may be higher than the withstand voltage performance of the first insulating layer 522. The withstand voltage performance according to the embodiment of the present disclosure may mean a characteristic which is maintained without insulation breakdown for 10 seconds under a voltage of AC 2.5 kV and a current of 1 mA. To this end, the second insulating layer 524 may include an aluminum oxide. For example, the second insulating layer 524 may be an aluminum oxide layer. Alternatively, the second insulating layer 524 may include a composite including silicon and aluminum. Here, the composite may be at least one of oxide, carbide, and nitride including silicon and aluminum. For example, the composite may include at least one of an Al—Si bond, an Al—O—Si bond, an Si—O bond, an Al—Si—O bond, and an Al—O bond. Like the above, the composite including at least one of the Al—Si bond, the Al—O—Si bond, the Si—O bond, the Al—Si—O bond, and the Al—O bond may have excellent insulation performance, and accordingly, high withstand voltage performance may be obtained. Alternatively, the composite may be oxide, carbide, or nitride further including titanium, zirconium, boron, zinc, etc. along with silicon and aluminum. To this end, the composite may be obtained through a heat treatment process after mixing at least one of an inorganic binder and an organic-inorganic mixed binder with aluminum. The inorganic binder may include at least one of silica ($SiO_2$), metal alkoxide, boron oxide ($B_2O_3$), and zinc oxide ($ZnO_2$), for example. The inorganic binder is inorganic particles but may be sol or gel to serve as a binder when coming into contact with water. In this case, at least one of silica ($SiO_2$), metal alkoxide, and boron oxide ($B_2O_3$) serves to increase adhesion with metal, and zinc oxide ($ZnO_2$) may serve to increase strength of the second insulating layer 524 and increase the thermal conductivity.

In this case, a resin content of the first insulating layer 522 may be higher than a resin content of the second insulating layer 524. Accordingly, an adhesive force of the first insulating layer 522 may be higher than an adhesive force of the second insulating layer 524, the coefficient of thermal expansion of the first insulating layer 522 may be higher than the coefficient of thermal expansion of the second insulating layer 524, and the withstand voltage performance and the heat conduction performance of the second insulating layer 524 may be higher than the withstand voltage performance and the heat conduction performance of the first insulating layer 522.

The thickness of the first insulating layer 522 may be greater than the thickness of the second insulating layer 524. For example, the thickness of the first insulating layer 522 may be 60 to 150 μm, preferably, 70 to 130 μm, and more preferably, 80 to 110 μm. Further, the thickness of the second insulating layer 524 may be 10 to 50 μm and, preferably, 20 to 40 μm. Accordingly, the first insulating layer 522 may alleviate a thermal stress applied to the insulating layer 520, and a thermoelectric element having high withstand voltage performance and high heat conduction performance may be obtained.

Meanwhile, as shown in FIGS. 5A and 5B, a separation distance d3 between the plurality of electrodes 530 may be different from a separation distance d2 between the plurality of second insulating layers 524. That is, as shown in FIG. 5A, the separation distance d3 between the plurality of electrodes 530 may be larger than the separation distance d2 between the plurality of second insulating layers 524. Alternatively, as shown in FIG. 5B, the separation distance d3 between the plurality of electrodes 530 may be smaller than the separation distance d2 between the plurality of second insulating layers 524. For example, the separation distance d3 between the plurality of electrodes 530 may be 0.6 to 2.8 times the separation distance d2 between the plurality of second insulating layers 524. When the separation distance d3 between the plurality of electrodes 530 is less than 0.6 times the distance d2 between the plurality of second insulating layers 524, since a contact area between the second insulating layer 524 and the electrode 530 is relatively small, an effect by thermal deformation of the second insulating layer 524 at a high temperature may be minimized, but insulation breakdown may easily occur in the region as the voltage increases, and thus withstand voltage characteristics may be degraded, and the electrode 530 may be separated from the second insulating layer 524. Further, when the separation distance d3 between the plurality of electrodes 530 exceeds 2.8 times the separation distance d2 between the plurality of second insulating layers 524, since the contact area between the second insulating layer 524 and the electrode 530 becomes relatively large, the withstand voltage characteristic may be improved, and separation of the electrode 530 from the second insulating layer 524 may be inhibited, but the thermal stress of the first insulating layer 522 at a high temperature may be transmitted to the second insulating layer 524 and thus thermal deformation may also occur in the second insulating layer 524, and the number of plurality of electrodes 530 disposed within a limited area may be relatively reduced. According to the embodiment of the present disclosure, the separation distance d3 between the plurality of electrodes 530 may be 0.6 to 0.99 times, preferably, 0.65 to 0.95 times, and more preferably, 0.7 to 0.9 times the separation distance d2 between the plurality of second insulating layers 524. Accordingly, it is possible to minimize the effect on the electrode 530 by the thermal deformation of the second insulating layer 524 at a high temperature. Alternatively, according to the embodiment of the present disclosure, the separation distance d3 between the plurality of electrodes 530 may be 1.01 to 2.8 times, preferably, 1.05 to 2.5 times, and more preferably, 1.1 to 2.2 times the separation distance d2 between the plurality of second insulating layers 524. Accordingly, since the second insulating layers 524 are respectively disposed at edges of the electrodes 530 where an electric field is concentrated, the withstand voltage performance of the thermoelectric element may further increase.

Although not shown, in a method of manufacturing the thermoelectric element according to FIGS. 5A and 5B, the thermoelectric element may be manufactured by disposing the electrodes 530 on which the second insulating layers 524 are disposed on the first insulating layer 522 and then curing the electrodes 530, or disposing the second insulating layers 524 on the first insulating layer 522 and then performing a separate scribing process.

Alternatively, as shown in FIG. 6, at least a part of the second insulating layer 524 may be further disposed on a side surface of at least one of the plurality of electrodes 530. That is, a part of the side surface of at least one of the plurality of electrodes 530 may be buried in the second insulating layer 524, and a maximum thickness T2 of at least one of the plurality of second insulating layers disposed on the side surface of at least one of the plurality of electrodes 530 may be 0.2 to 0.75 times, preferably, 0.25 to 0.6 times, and more preferably, 0.3 to 0.5 times a maximum thickness T3 of at least one of the plurality of electrodes 530.

Accordingly, since the second insulating layers 524 are respectively disposed at edges of the electrodes 530 where an electric field is concentrated, the withstand voltage performance of the thermoelectric element may further increase.

Specifically, as shown in FIG. 6, when at least the part of the second insulating layer 524 is further disposed on the side surface of at least one of the plurality of electrodes 530, since heat loss through a horizontal direction of each electrode 530 may be reduced, thermoelectric performance of the thermoelectric element may be further improved.

Figure 7A:
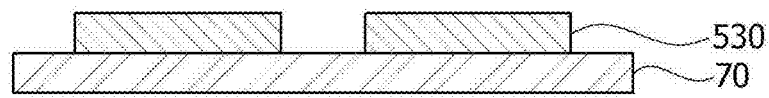
FIGS. 7A-7D are views illustrating a process of manufacturing the substrate, the insulating layer, and the electrode in FIG. 6.
Figure 7B:
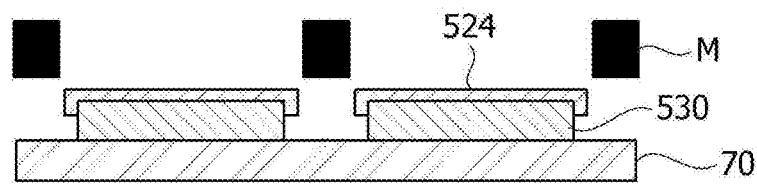
Figure 7C:
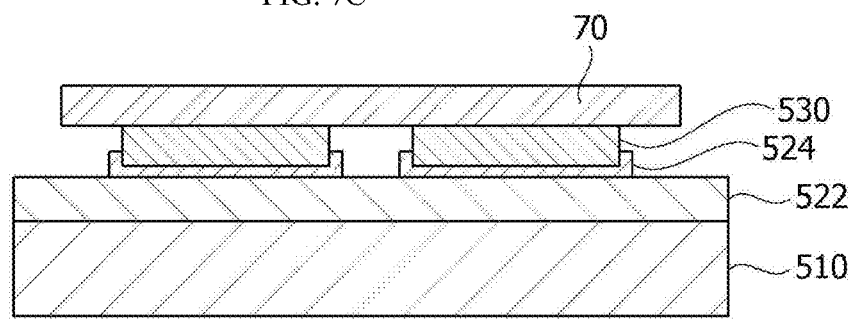
Figure 7D:
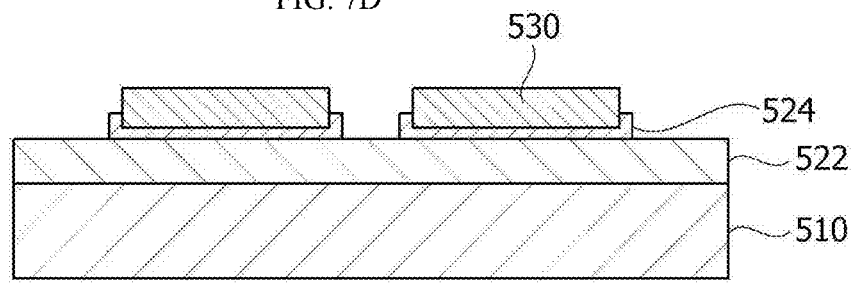

In order to manufacture the thermoelectric element according to FIG. 6, referring to FIG. 7A, the plurality of electrodes 530 are disposed on a sheet 70. Here, the sheet 70 may be a thermal sheet or a release film. Subsequently, referring to FIG. 7B, after disposing a mask M on the electrodes 530, spray coating is performed with a material forming the second insulating layer 524. In this case, an open region of the mask may be larger than a width of the electrode 530. Accordingly, the second insulating layer 524 may also be formed on the side surface of the electrode 530. Subsequently, referring to FIG. 7C, after coating a material forming the first insulating layer 522 on the substrate 510 in advance, the electrodes 530 and the second insulating layers 524 formed through operations in FIGS. 7A and 7B are transferred. Further, referring to FIG. 7D, after the first insulating layer 522 is cured, the sheet 70 may be removed from the electrode 530 to be manufactured, but the present disclosure is not limited to the manufacturing method.

Accordingly, it is possible to obtain the thermoelectric element including the plurality of second insulating layers 524 disposed on the first insulating layer 522 to be spaced apart from each other and the plurality of electrodes 530 disposed on the plurality of second insulating layers 524, and in which the second insulating layers 524 are further disposed on the side surfaces of the electrodes 530.

Hereinafter, effects of the thermoelectric element according to the embodiment of the present disclosure will be described through Comparative Examples and Examples.

Figure 8A:
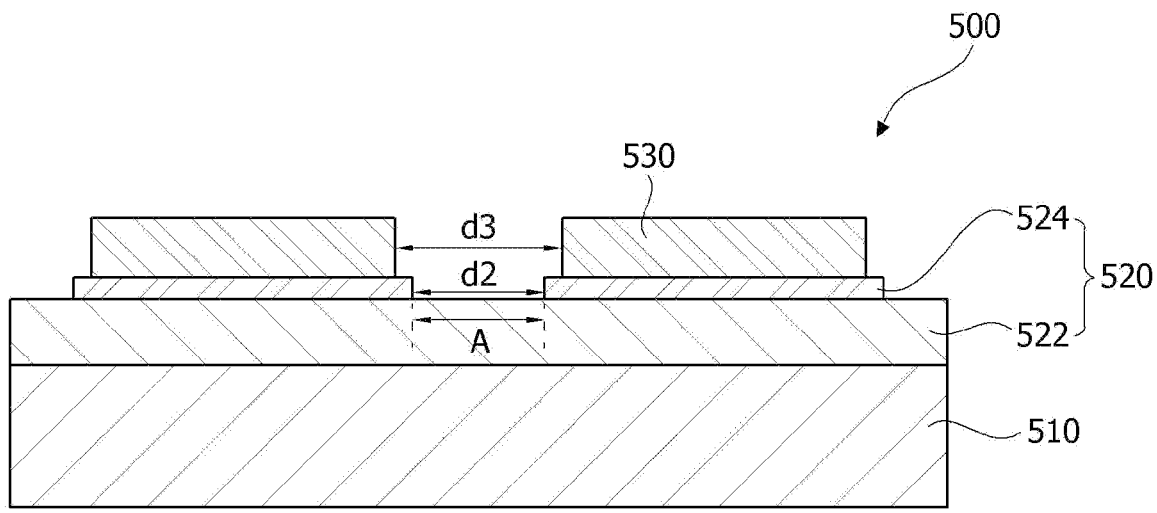
FIG. 8A illustrates a cross-sectional structure of a thermoelectric element according to Example.
Figure 8B:
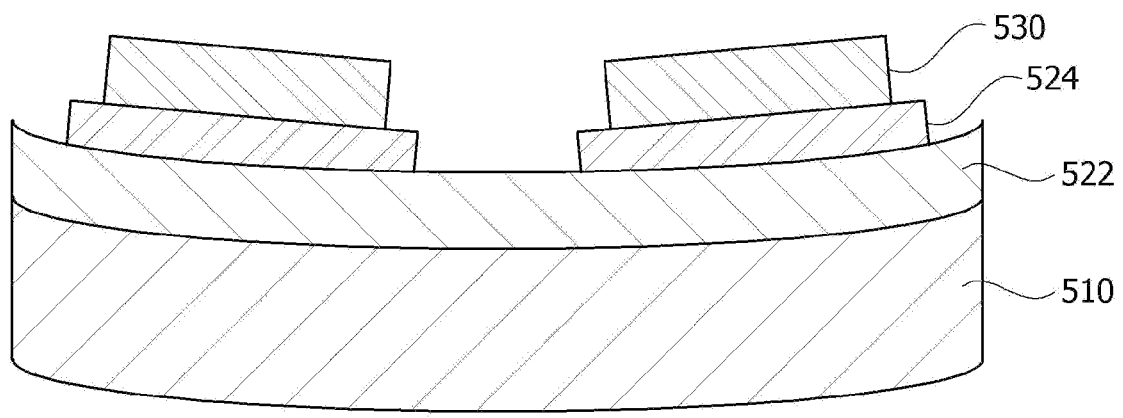
FIG. 8B illustrates an expected change in the case in which the thermoelectric element according to Example is exposed for a long time under a high-temperature condition.
Figure 9A:
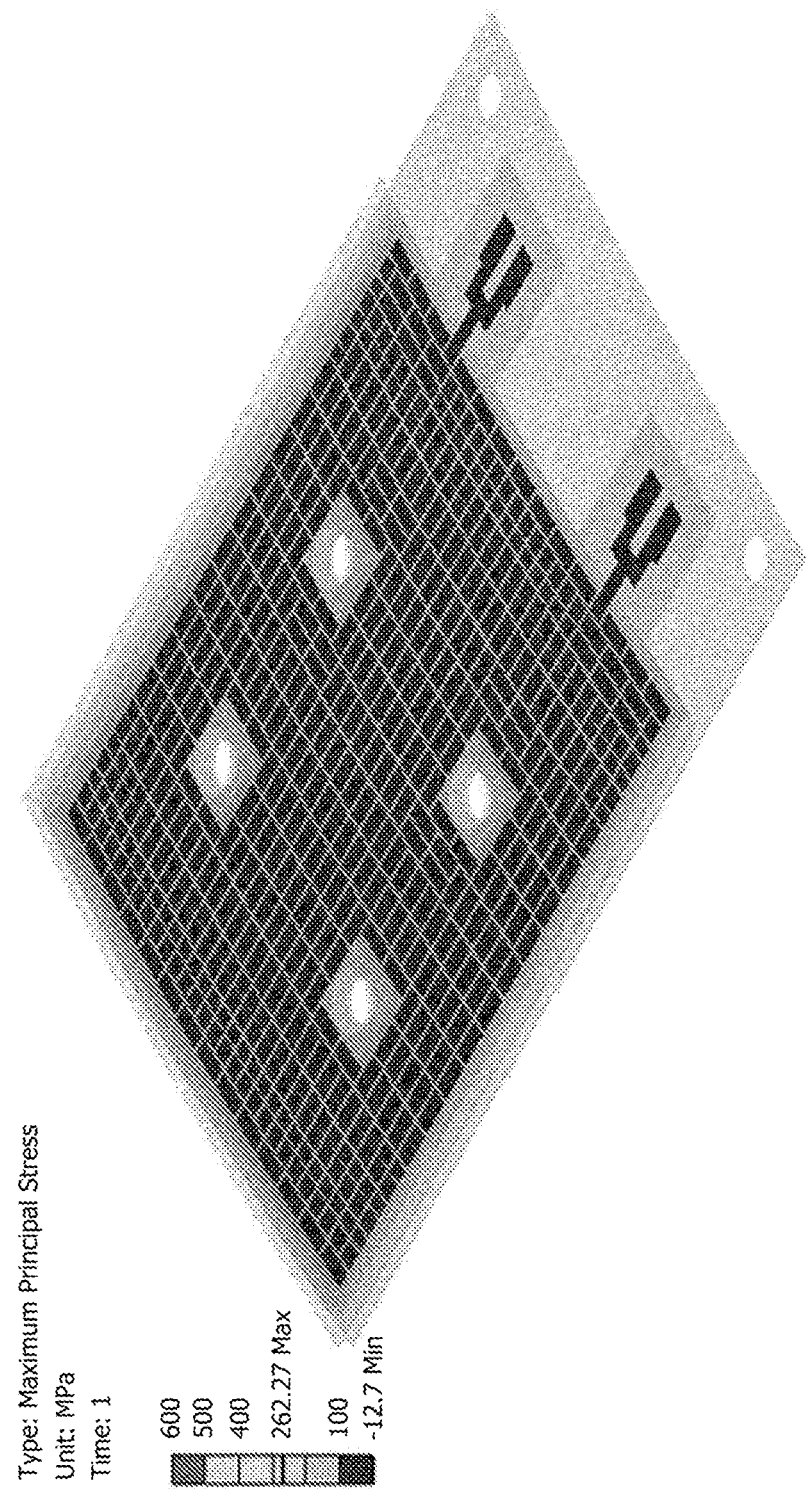
FIGS. 9A and 9B show results of simulation of stress and warpage of the thermoelectric element according to Example.
Figure 9B:
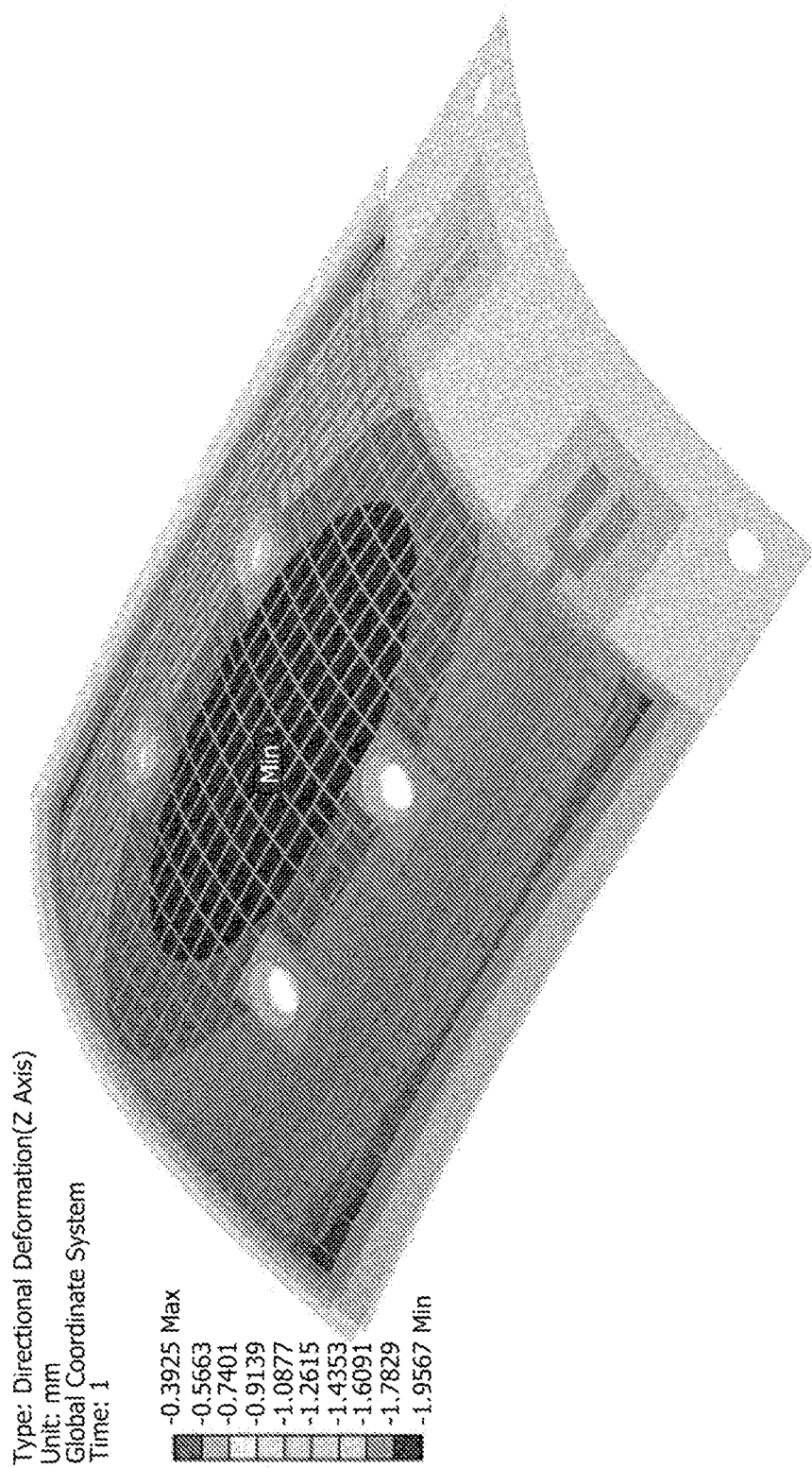
Figure 10A:
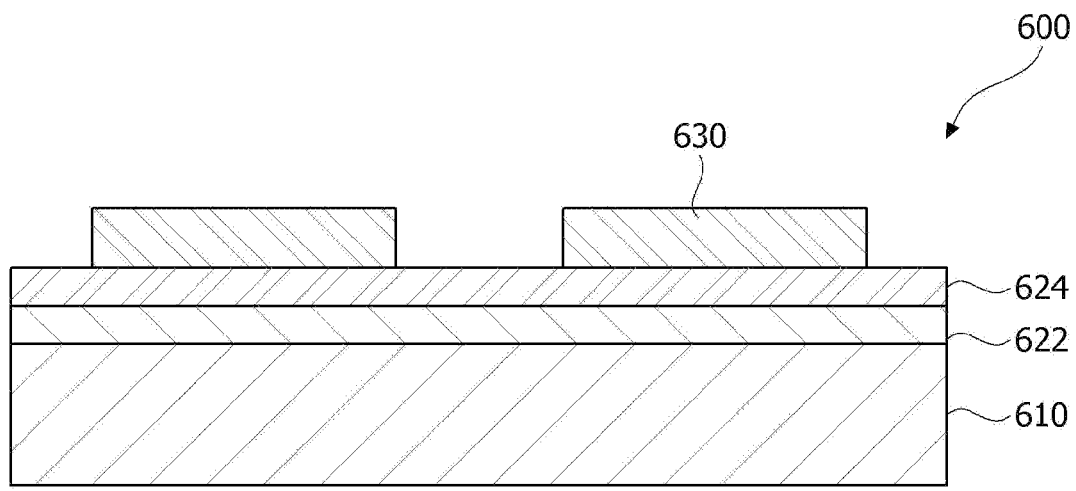
FIG. 10A illustrates a cross-sectional structure of a thermoelectric element according to Comparative Example.
Figure 10B:
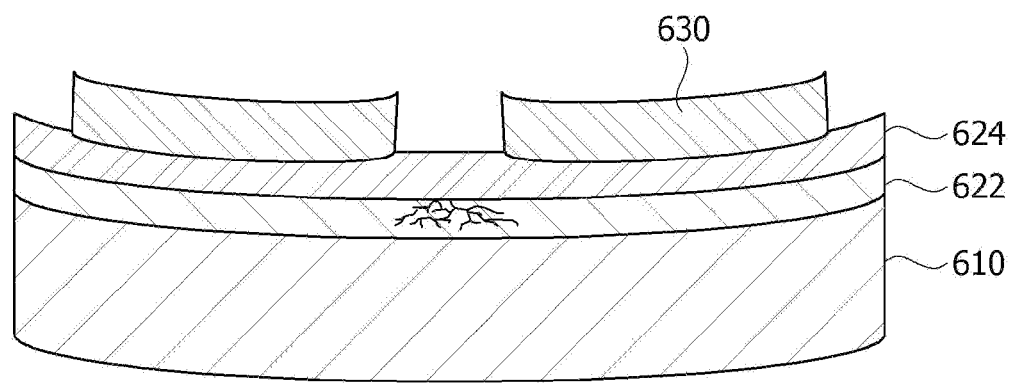
FIG. 10B illustrates an expected change in the case in which the thermoelectric element according to Comparative Example is exposed for a long time under a high-temperature condition.
Figure 11A:
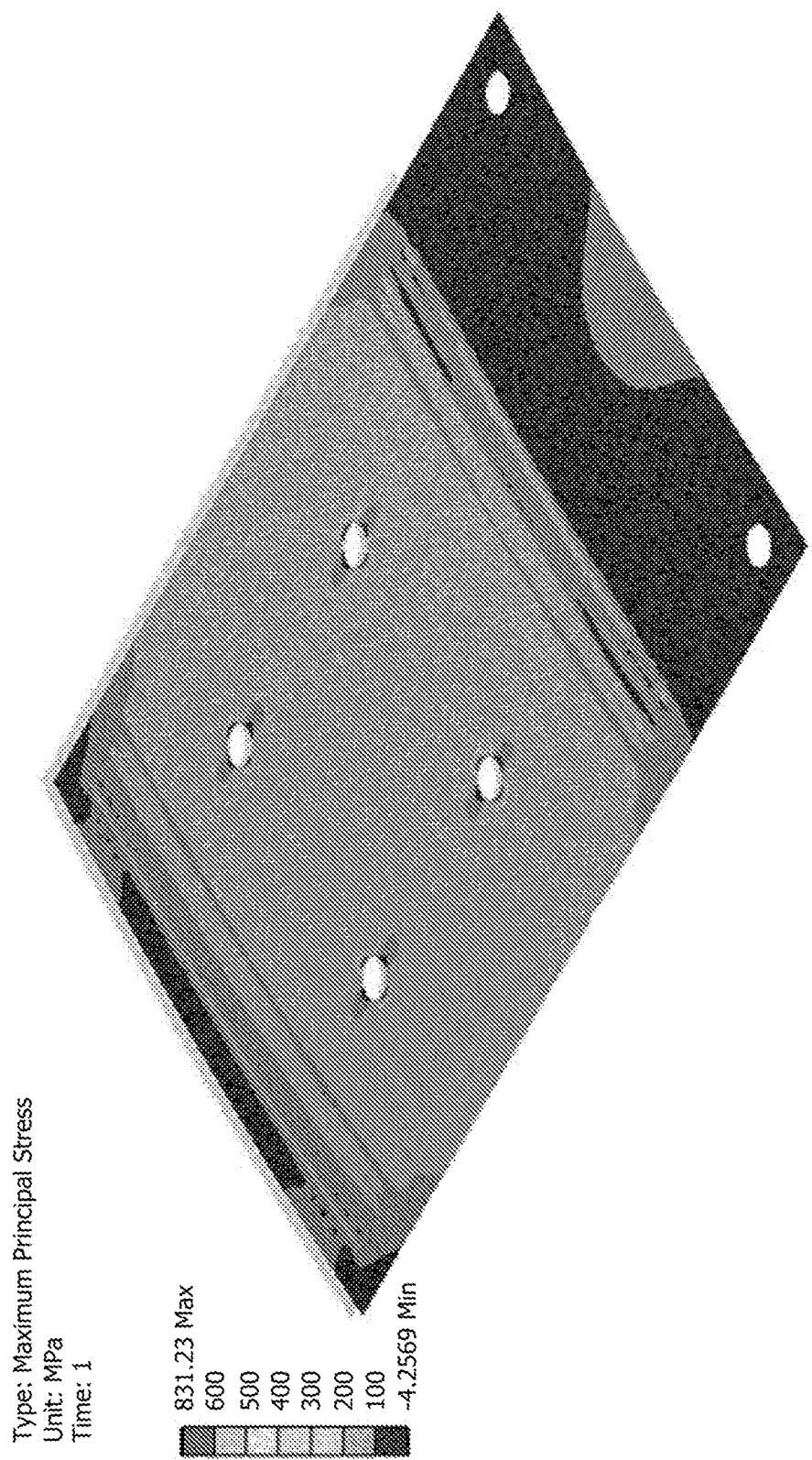
FIGS. 11A and 11B show results of simulation of stress and warpage of the thermoelectric element according to Comparative Example.
Figure 11B:
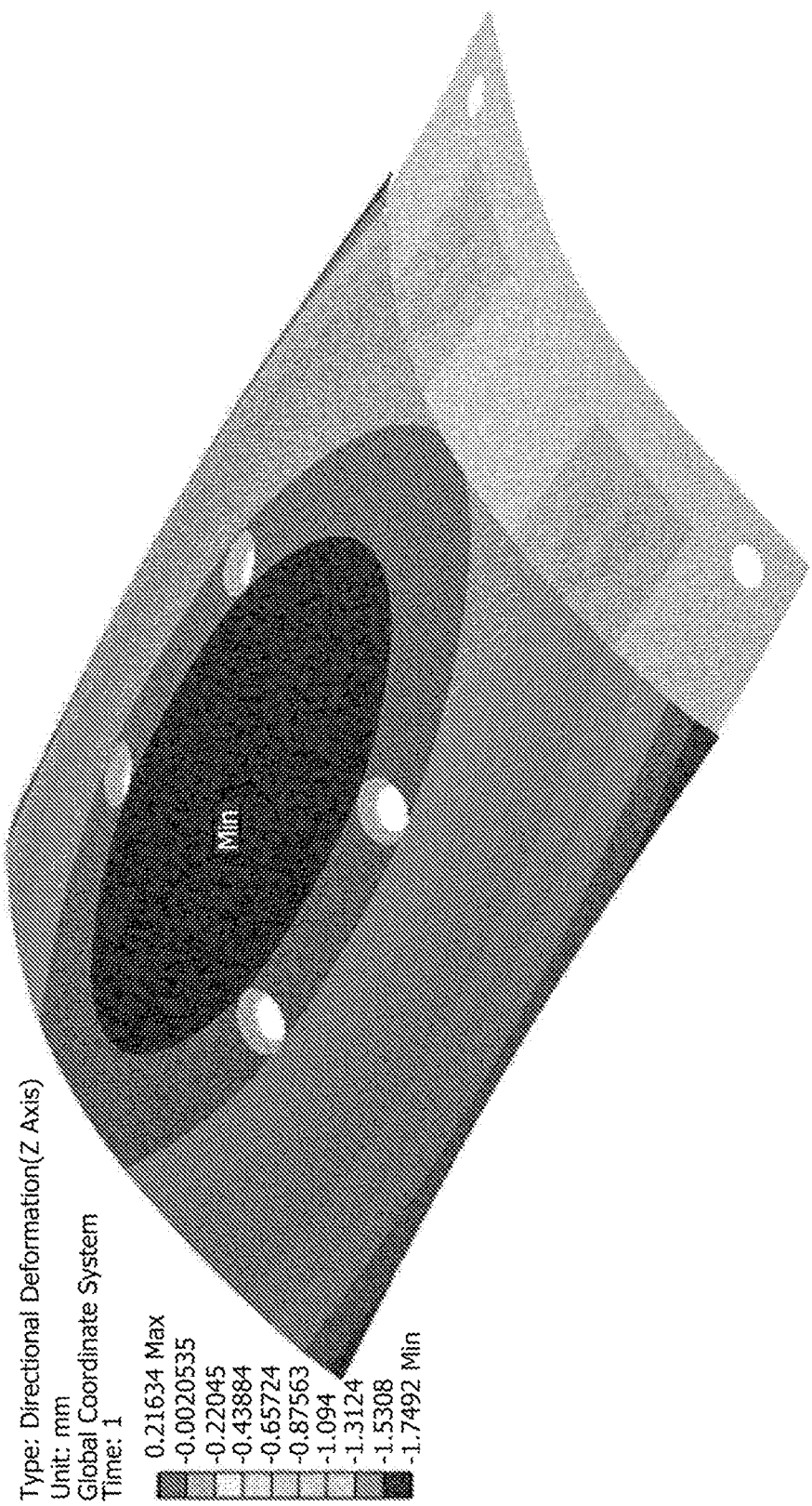

FIG. 8A illustrates a cross-sectional structure of a thermoelectric element according to Example, FIG. 8B illustrates an expected change in the case in which the thermoelectric element according to Example is exposed for a long time under a high-temperature condition, FIG. 9A shows a result of simulation of stress applied to a second insulating layer of the thermoelectric element according to Example, FIG. 9B shows a result of simulation of warpage of the thermoelectric element according to Example, FIG. 10A illustrates a cross-sectional structure of a thermoelectric element according to Comparative Example, FIG. 10B illustrates an expected change in the case in which the thermoelectric element according to Comparative Example is exposed for a long time under a high-temperature condition, FIG. 11A shows a result of simulation of stress applied to a second insulating layer of the thermoelectric element according to Comparative Example, and FIG. 11B shows a result of simulation of warpage of the thermoelectric element according to Comparative Example.

As shown in FIG. 8A, a thermoelectric element 500 according to Example includes a substrate 510, a first insulating layer 522 disposed on the entire surface of the substrate 510, and a plurality of second insulating layers 524 disposed on the first insulating layer 522 to be spaced apart from each other, and a plurality of electrodes 530 disposed on the plurality of second insulating layers 524, and a coefficient of thermal expansion of the first insulating layer 522 is larger than a coefficient of thermal expansion of the second insulating layer 524. Accordingly, when the thermoelectric element 500 according to Example is exposed to a high temperature for a long time, as shown in FIG. 8B, compared to thermal deformation of the substrate 510 and the first insulating layer 522, thermal deformation of the second insulating layers 524 is relatively small.

On the other hand, as shown in FIG. 10A, a thermoelectric element 600 according to Comparative Example includes a substrate 610, a first insulating layer 622 disposed on the entire surface of the substrate 610, a second insulating layer 624 disposed on the entire surface of the first insulating layer 622, and a plurality of electrodes 630 disposed on the second insulating layer 624 to be spaced apart from each other, and a coefficient of thermal expansion of the second insulating layer 624 is larger than a coefficient of thermal expansion of the first insulating layer 622. That is, the first insulating layer 522 of the thermoelectric element 500 according to Example and the second insulating layer 624 of the thermoelectric element 600 according to Comparative Example have the same composition, and the second insulating layers 524 of the thermoelectric element 500 according to Example and the first insulating layer 622 of the thermoelectric element 600 according to Comparative Example may have the same composition. Accordingly, when the thermoelectric element 600 according to Comparative Example is exposed to a high temperature for a long time, reliability of the thermoelectric element may be degraded due to thermal stress of the first insulating layer 622.

The above may be known from FIGS. 9A, 9B, 11A, and 11B. Referring to FIGS. 9A and 9B, it can be seen that maximum stress applied to the second insulating layers 524 according to Example of the present disclosure is 262 MPa, average stress is 32.37 MPa, and maximum warpage is 1.56 mm. On the other hand, referring to FIGS. 11A and 11B, it can be seen that maximum stress applied to the first insulating layer 622 according to Comparative Example is 831 MPa, average stress is 214.47 MPa, and maximum warpage is 1.8 mm.

Like the above, in the thermoelectric element according to the embodiment of the present disclosure, even when the thermoelectric element is exposed to a high temperature for a long time, since the thermal stress applied to the insulating layer is low and warpage is small, it can be seen that application of cracks to the thermoelectric legs due to breakage of the insulation layer, destruction of the electrode structure, or the like may be inhibited.

The structure of the substrate, the insulating layer, and the electrode according to the embodiment of the present disclosure may be applied to at least one of the high-temperature part side and the low-temperature part side of the thermoelectric element.

In this case, a heat sink 200 may be further disposed on the substrate at the high-temperature part side of the thermoelectric element.

Figure 12:
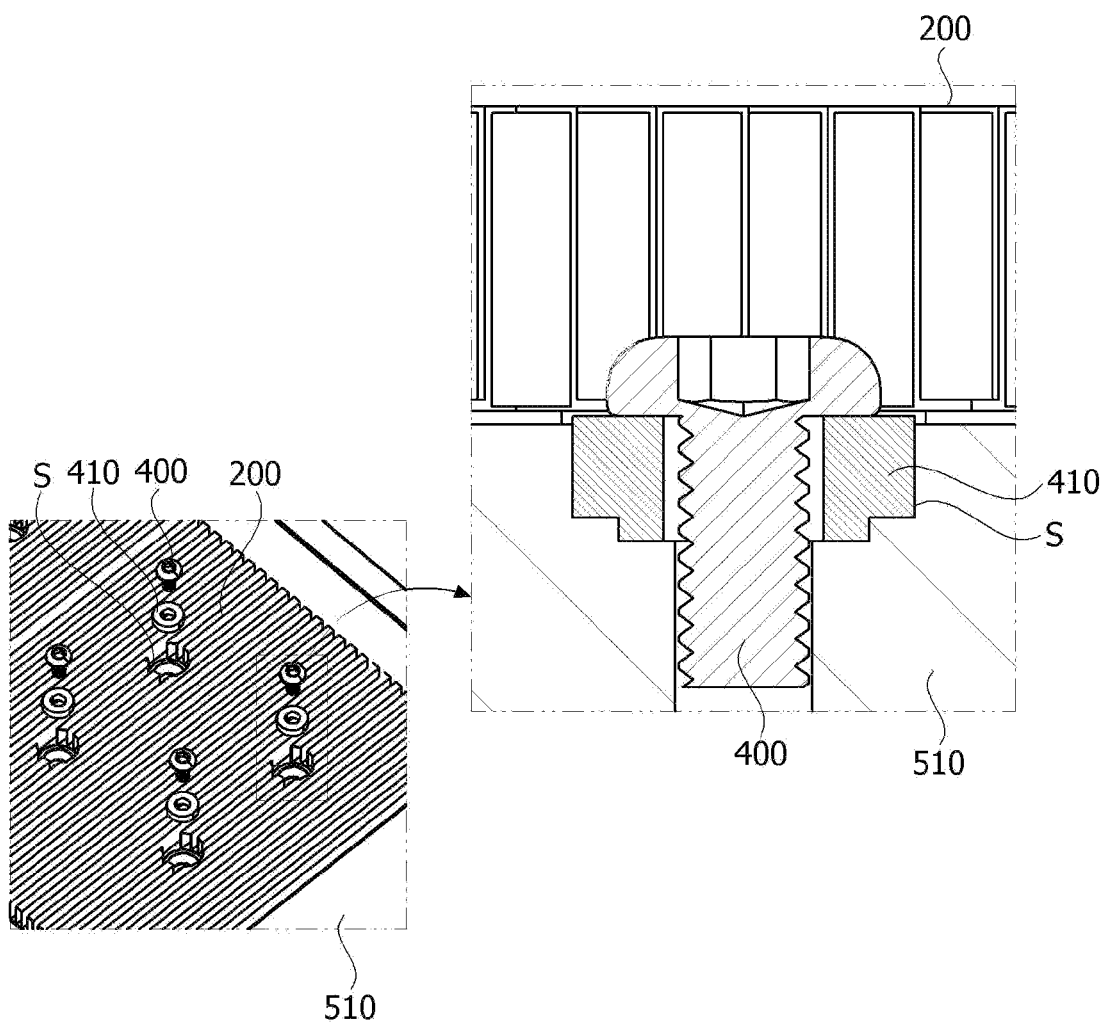
FIG. 12 exemplifies a bonding structure between a substrate and a heat sink of the thermoelectric element.

FIG. 12 exemplifies a bonding structure between a substrate and a heat sink of the thermoelectric element.

Referring to FIG. 12, the heat sink 200 and the substrate 510 may be fastened by a plurality of fastening members 400. To this end, through holes S through which the fastening members 400 pass may be formed in the heat sink 200 and the substrate 510. Here, separate insulators 410 may be further disposed between the through holes S and the fastening members 400. The separate insulator 410 may be an insulator surrounding an outer circumferential surface of the fastening member 400 or an insulator surrounding a wall surface of the through hole S. Accordingly, it is possible to increase an insulation distance of the thermoelectric element.

Although preferable embodiments of the present disclosure are described above, those skilled in the art may variously modify and change the present disclosure within the scope of the spirit and area of the present disclosure disclosed in the claims which will be described later.

The invention claimed is:

1. A thermoelectric element comprising:
    a first metal substrate;
    a first insulating layer disposed on the first metal substrate;
    a plurality of second insulating layers disposed on the first insulating layer to be spaced apart from each other,
    a plurality of first electrodes disposed on the plurality of second insulating layers to be spaced apart from each other;
    a plurality of P-type thermoelectric legs and a plurality of N-type thermoelectric legs disposed on the plurality of first electrodes;
    a plurality of second electrodes disposed on the plurality of P-type thermoelectric legs and the plurality of N-type thermoelectric legs to be spaced apart from each other;

a third insulating layer disposed on the plurality of second electrodes; and a second metal substrate disposed on the third insulating layer, wherein the first insulating layer is a resin layer including a silicone resin and an inorganic material, and the second insulating layer is an aluminum oxide layer or a composite layer formed of a composite including silicon and aluminum.

2. The thermoelectric element of claim 1, wherein the plurality of first electrodes are disposed on the plurality of second insulating layers to correspond to the plurality of second insulating layers.

3. The thermoelectric element of claim 2, wherein a separation distance between the plurality of first electrodes is 0.6 to 2.8 times a separation distance between the plurality of second insulating layers.

4. The thermoelectric element of claim 1, wherein at least one of the plurality of second insulating layers is further disposed on a part of a side surface of at least one of the plurality of first electrodes.

5. The thermoelectric element of claim 4, wherein a maximum thickness of the at least one of the plurality of second insulating layers disposed on the part of the side surface of the at least one of the plurality of first electrodes is 0.2 to 0.75 times a maximum thickness of the at least one of the plurality of first electrodes.

6. The thermoelectric element of claim 1, wherein a coefficient of thermal expansion of the first insulating layer is larger than a coefficient of thermal expansion of each of the second insulating layers.

7. The thermoelectric element of claim 1, wherein a thickness of the first insulating layer is larger than a thickness of each of the second insulating layers.

8. The thermoelectric element of claim 1, comprising a fourth insulating layer disposed between the plurality of second electrodes and the third insulating layer.

9. The thermoelectric element of claim 8, wherein the fourth insulating layer includes a plurality of fourth insulating layers which are disposed to be spaced apart from each other.

10. The thermoelectric element of claim 9, wherein the plurality of second electrodes are disposed under the plurality of fourth insulating layers to correspond to the plurality of fourth insulating layers.

11. The thermoelectric element of claim 1, wherein the silicone resin includes polydimethylsiloxane (PDMS) of which a molecular weight is 5,000 to 30,000 g/mol.

12. The thermoelectric element of claim 1, wherein Young's modulus of the first insulating layer is less than Young's modulus of the second insulating layers.

13. The thermoelectric element of claim 1, wherein at least one of a withstand voltage performance and a thermal conductivity performance of the second insulating layers is greater than at least one of a withstand voltage performance and a thermal conductivity performance of the first insulating layer.

14. The thermoelectric element of claim 3, wherein the separation distance between the plurality of first electrodes is 0.6 to 0.99 times the separation distance between the plurality of second insulating layers.

15. The thermoelectric element of claim 3, wherein the separation distance between the plurality of first electrodes is 1.01 to 2.8 times the separation distance between the plurality of second insulating layers.

16. The thermoelectric element of claim 1, wherein the first metal substrate is Cu substrate and the second metal substrate is Al substrate.

17. The thermoelectric element of claim 1, wherein a total area of the first insulating layer is larger than a total area of the plurality of second insulating layers.

18. The thermoelectric element of claim 1, wherein two or more first electrodes are spaced apart from each other on each second insulating layer.

19. The thermoelectric element of claim 8, wherein Young's modulus of the first insulating layer differs from Young's modulus of the third insulating layer.

* * * * *